United States Patent
Kawano et al.

(10) Patent No.: US 8,691,338 B2
(45) Date of Patent: Apr. 8, 2014

(54) POLYMERIZED FILM FORMING METHOD AND POLYMERIZED FILM FORMING APPARATUS

(75) Inventors: Yumiko Kawano, Yamanashi (JP); Yusaku Kashiwagi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 148 days.

(21) Appl. No.: 13/063,779

(22) PCT Filed: Jul. 17, 2009

(86) PCT No.: PCT/JP2009/062956
§ 371 (c)(1),
(2), (4) Date: Mar. 14, 2011

(87) PCT Pub. No.: WO2010/032547
PCT Pub. Date: Mar. 25, 2010

(65) Prior Publication Data
US 2011/0171384 A1    Jul. 14, 2011

(30) Foreign Application Priority Data
Sep. 16, 2008 (JP) ................. 2008-236819

(51) Int. Cl.
C23C 16/00 (2006.01)
B05D 5/00 (2006.01)
B05D 3/00 (2006.01)

(52) U.S. Cl.
USPC .......... 427/255.28; 427/255.23; 427/248.1; 427/256; 427/271

(58) Field of Classification Search
USPC .......... 427/255.28, 255.23, 248.1, 256, 271
See application file for complete search history.

(56) References Cited

U.S. PATENT DOCUMENTS

| 5,937,272 A * | 8/1999 | Tang ................................ 438/30 |
| 8,313,603 B2 * | 11/2012 | Ikeda et al. ................... 156/230 |
| 2007/0122936 A1 * | 5/2007 | Park et al. ....................... 438/77 |
| 2009/0075214 A1 * | 3/2009 | Hirakata et al. .............. 430/319 |

FOREIGN PATENT DOCUMENTS

JP       05-171415 A       7/1993
(Continued)

OTHER PUBLICATIONS

Hebner et al. Ink-jet printing of doped polymers for organic light emitting devices, Applied Physics Letters, vol. 72 No. 5, Feb. 1998, pp. 519-521.*

(Continued)

*Primary Examiner* — Kelly M Gambetta
(74) *Attorney, Agent, or Firm* — Pearne & Gordon LLP

(57) ABSTRACT

A first substrate has a source material forming surface on which source materials for forming a polymerized film is formed in a predetermined pattern, and a second substrate has a film forming surface on which the polymerized film will be formed. Here, the first substrate and the second substrate are installed in a processing chamber such that the source material forming surface and the film forming surface face each other. Then, the first substrate is heated to a first temperature at which the source materials on the source material forming surface are evaporated and the second substrate is heated to a second temperature at which the source materials cause polymerization reaction on the film forming surface. Therefore, the polymerized film is formed on the film forming surface by reacting the source materials and evaporated from the first substrate on the film forming surface of the second substrate.

9 Claims, 5 Drawing Sheets

(56) References Cited

FOREIGN PATENT DOCUMENTS

| JP | 09-326388 A | | 12/1997 |
|---|---|---|---|
| JP | 2001-011176 A | | 1/2001 |
| JP | 2001011176 A | * | 1/2001 |
| JP | 2002-285320 A | | 10/2002 |
| KR | 10-2005-0109601 A | | 11/2005 |
| KR | 10-2008-0019061 A | | 2/2008 |

OTHER PUBLICATIONS

Lim et al. Organic electroluminescent devices based on polyurethane derivatives: effects of substituents on electroluminescent and photoluminescent properties, Thin Solid Films, vol. 363, 2000, pp. 152-155.*

Merriam-Webster Dictionary, "mechanism", http://merriam-webster.com/dictionary/mechanism, accessed Jul. 3, 2013.*

International Search Report for PCT/JP2009/062956 dated Aug. 11, 2009.

Beyne, "The Rise of the 3rd Dimension for System Integration," IMEC, Proceedings of the International Interconnect Technology Conference, 2006, pp. 1-5, Leuven, Belgium.

Iijima, et al., "Electrical, Thermal and Mechanical Properties of Polyimide Thin Films Prepared by High-Temperature Vapor Deposition Polymerization," High Perform Polym. 5, 1993, pp. 229-237.

* cited by examiner

POLYMERIZED FILM FORMING METHOD AND POLYMERIZED FILM FORMING APPARATUS

CROSS-REFERENCE TO RELATED APPLICATION

This Application is a U.S. national phase application under 35 U.S.C. §371 of PCT Application No. PCT/JP2009/062956 filed on Jul. 17, 2009, which claims the benefit of Japanese Patent Application No. 2008-236819 filed on Sep. 16, 2008, the entire disclosures of which are incorporated herein by reference.

TECHNICAL FIELD

The present invention relates to a polymerized film forming method and a polymerized film forming apparatus for forming a polymerized film such as a polyimide film by using an evaporation method.

BACKGROUND ART

As for a technique for achieving high performance and miniaturization of electronic devices, a system in package (SiP) in which a multiple number of semiconductor chips is incorporated in a single semiconductor package has become an important technique. In this technique, a two-dimensional package in which semiconductor chips are horizontally arranged in parallel has been conventionally widely used. However, recently, a three-dimensional package in which semiconductor chips are stacked vertically attracts attention in order to achieve further miniaturization of electronic devices (see, e.g., Non-Patent Document 1 (Eric Beyne, Proceedings of the International Interconnect Technology Conference 2006, pp. 1-5)).

In the three-dimensional package, in order to stack the semiconductor chips with high density, a technique for insulating the semiconductor chips is important. In such an insulating technique, it is considered that a polymerized film made of a polyimide is used.

However, a polymerized film formed by a solvent coating method as a general polymerization film forming method is insufficient to ensure high insulation property required for isolation between the chips. This is because a path where the solvent is discharged functions as a leak port. The path where the solvent is discharged also functions as a moisture intrusion path, so that the water resistance of the polymerized film is insufficient.

As for a technique for forming a high-performance polymerized film capable of preventing the above-described problems, there is suggested a technique for depositing a polymerized film on a substrate by supplying, into a chamber maintained in a vacuum state, gaseous monomers obtained by heating and evaporating two or more source monomers in different containers (Patent Document 1 (Japanese Patent Laid-open Publication No. H5-171415), Non-Patent Document 2 (High Perform. Polym. 5(1993) 229-237))

In this technique, the gaseous monomers obtained by heating and evaporating the source monomers in the containers need to be supplied into the chamber via a pipe. Thus, the gaseous monomers are supplied at a flow rate controlled by a high-temperature mass flow controller while controlling the temperature of the pipe by a heater.

Since, however, the temperature of the pipe needs to be maintained at about 200° C. depending on source materials, there may be a case where the heat resistance of the pipe or the valve is insufficient. Further, the source materials may be unstably supplied due to temperature non-uniformity during heating by the heater.

DISCLOSURE OF THE INVENTION

In view of the foregoing, the present invention provides a polymerized film forming method and a polymerized film forming apparatus capable of forming a polymerized film by evaporation without causing the above-described problems during processes of heating and supplying source materials.

In accordance with a first aspect of the present invention, there is provided a polymerized film forming method including: providing, in a processing chamber, a first substrate having a source material forming surface on which a plurality of solid source materials for forming a polymerized film is formed in a predetermined pattern and a second substrate having a film forming surface on which the polymerized film is formed, the source material forming surface and the film forming surface facing each other; setting the internal pressure of the processing chamber where the first and the second substrate are provided to a predetermined vacuum level by evacuating the inside of the processing chamber; and heating, under the predetermined vacuum level, the first substrate to a first temperature at which the source materials on the source material forming surface are evaporated and heating the second substrate to a second temperature at which the source materials cause polymerization reaction on the film forming surface. Here, the polymerized film may be formed on the film forming surface by reacting the source materials evaporated from the first substrate on the film forming surface of the second substrate.

In accordance with the polymerized film forming method of the first aspect, the source materials may be formed on the source material forming surface of the first substrate by any one of coating, printing and photolithography. Further, the source materials may be formed on the source material forming surface of the first substrate and evaporated so as to obtain a stoichiometric composition of the polymerized film. Furthermore, the source materials may include a first source material and a second source material. In this case, the first source material and the second source material may be formed in a check pattern on the source material forming surface of the first substrate.

Desirably, the first substrate and the second substrate may be heated by different heating mechanisms. Desirably, the heating mechanisms may have induction heating coils.

The source materials of the first substrate may be formed on a heat transfer adjustment member for adjusting heat transfer to allow each of the temperatures of the source materials to reach an optimal level when the first substrate is heated to the first temperature.

As a typical example of the polymerized film forming method of the first aspect, a polyimide film as the polymerized film may be formed by using pyromellitic dianhydride (PMDA) and 4,4'-diaminodiphenyl ether (ODA) as the source materials. In this case, the first temperature may be within a range of about 200° C. to about 260° C., and the second temperature may be within a range of about 180° C. to about 230° C.

In accordance with a second aspect of the present invention, there is provided a polymerized film forming apparatus including: a processing chamber of which inside is maintained in a vacuum state; a gas exhaust mechanism configured to set the internal pressure of the processing chamber to a predetermined vacuum level by evacuating the inside of the processing chamber; a substrate supporting unit configured to provide, in the processing chamber, a first substrate having a source material forming surface on which a plurality of solid source materials for forming a polymerized film is formed in a predetermined pattern and a second substrate having a film forming surface on which the polymerized film is formed, the source material forming surface and the film forming surface facing each other; a first heating mechanism configured to heat, under the predetermined vacuum level, the first substrate to a first temperature at which the source materials on the source material forming surface are evaporated; and a second heating mechanism configured to heat, under the predetermined vacuum level, the second substrate to a second temperature at which the source materials cause polymerization reaction on the film forming surface. Here, the polymerized film may be formed on the film forming surface by reacting the source materials evaporated from the first substrate on the film forming surface of the second substrate.

In accordance with the polymerized film forming apparatus of the second aspect, the first and second heating mechanisms may rapidly heat the first and second substrates, independently. Desirably, the first and second heating mechanisms may have induction heating coils. In this case, the substrate supporting unit may include a pair of heat transfer members configured to support the first and second substrates and transfer heat generated by induction heating to the first and second substrates.

In accordance with the polymerized film forming apparatus of the second aspect, the source materials may be formed on the source material forming surface of the first substrate by any one of coating, printing and photolithography. Further, the source materials may be formed on the source material forming surface of the first substrate and evaporated so as to obtain a stoichiometric composition of the polymerized film.

The source materials of the first substrate may be formed on a heat transfer adjustment member for adjusting heat transfer to allow each of the temperatures of the source materials to reach an optimal level when the first substrate is heated to the first temperature.

The substrate supporting unit may support a plurality of pairs of a first and a second substrate, and the first and second substrates of each pair may be heated to the first and second temperatures by the first and second heating mechanisms, respectively.

In accordance with a third aspect of the present invention, there is provided a computer-executable storage medium for storing a program for controlling a film forming apparatus. Here, the program, when executed, may control the film forming apparatus on a computer to perform the film forming method of the first aspect.

BEST MODE FOR CARRYING OUT THE INVENTION

Figure 1:
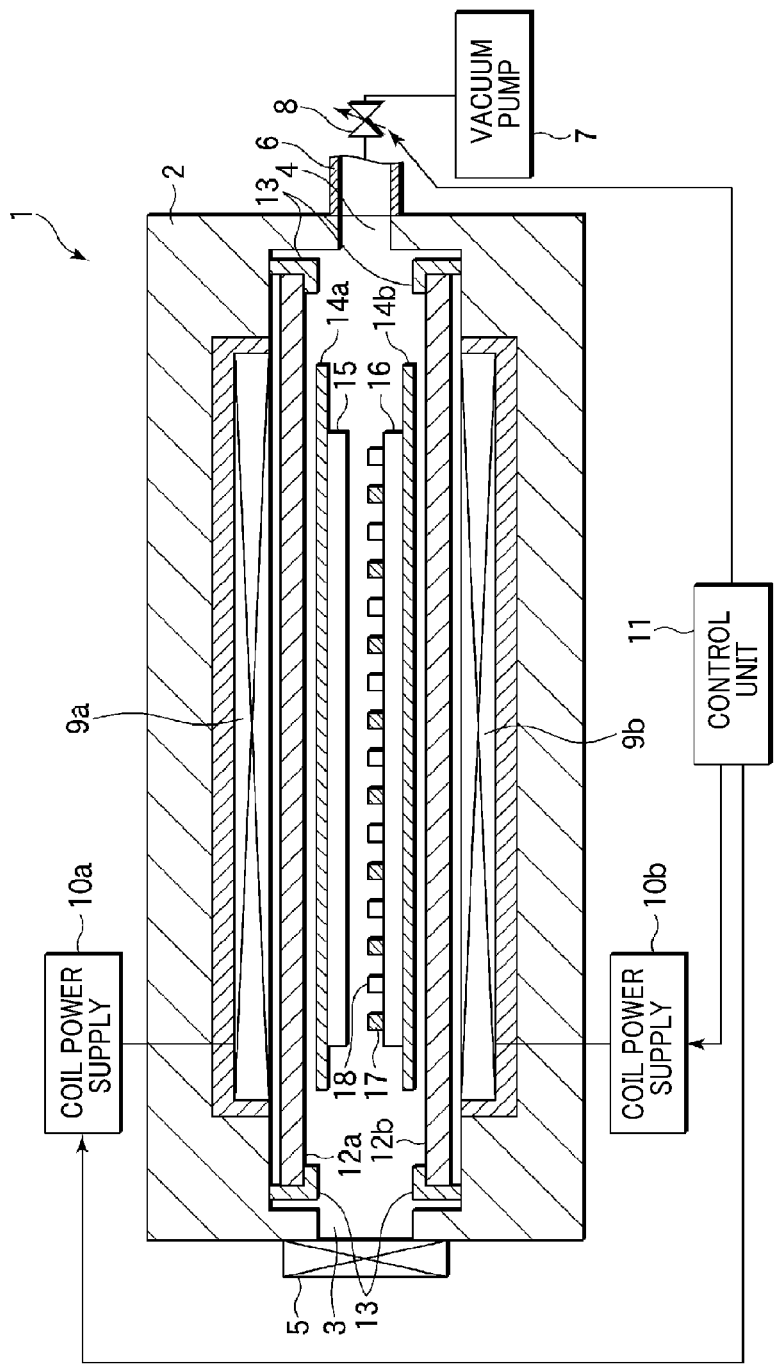
FIG. 1 is a cross sectional view of a polymerized film forming apparatus in accordance with a first embodiment of the present invention.

Hereinafter, the embodiments of the present invention will be described with reference to the accompanying drawings. FIG. 1 is a cross sectional view of a polymerized film forming apparatus in accordance with a first embodiment of the present invention.

A film forming apparatus 1 includes a chamber 2, and a loading/unloading port 3 and a gas exhaust port 4 provided at a sidewall of the chamber 2. The loading/unloading port 3 is openable and closable by a gate valve 5. Further, the gas exhaust port 4 is connected to a gas exhaust line 6, and the gas exhaust line 6 is connected to a pressure control valve 8 and a vacuum pump 7. By controlling an opening degree of the pressure control valve 8 while operating the vacuum pump 7, an internal pressure of the chamber 2 is controlled to a predetermined vacuum level. In addition, the internal pressure of the chamber 2 can be controlled by introducing a nonreactive gas such as Ar gas from a gas supply system (not shown) into the chamber 2. Moreover, a cleaning gas supply system that supplies a cleaning gas for cleaning the inside of the chamber 2 may be installed.

Figure 2:
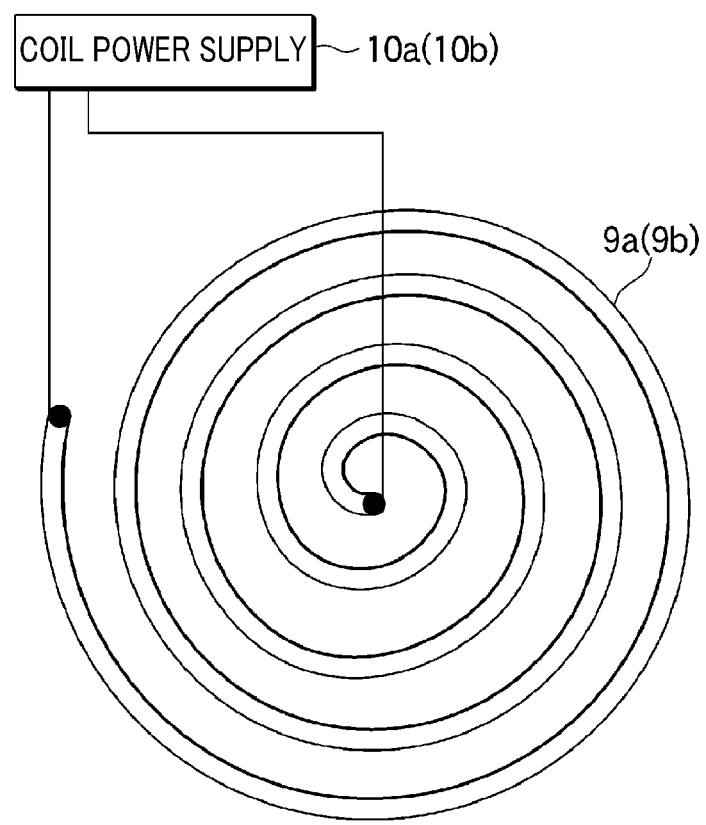
FIG. 2 is a plane view showing an induction heating coil of the polymerized film forming apparatus of FIG. 1.

Induction heating coils 9a and 9b are installed at a top wall and a bottom wall of the chamber 2, respectively. As shown in FIG. 2, the induction heating coils 9a and 9b have a spiral shape and are connected to coil power supplies 10a and 10b, respectively. The coil power supplies 10a and 10b are connected with and controlled by a control unit 11. Further, the control unit 11 controls outputs of the coil power supplies 10a and 10b such that heating temperatures of the induction heating coils 9a and 9b are controlled. Moreover, a wall heater (not shown) is installed at a chamber wall, so that a temperature of the chamber wall can be controlled to a predetermined level.

Shielding members 12a and 12b for shielding the induction heating coils 9a and 9b are installed at a lower portion of the induction heating coil 9a and an upper portion of the induction heating coil 9b, respectively. The shielding members 12a and 12b are fixed to the chamber 2 by fitting members 13.

In the chamber 2, an upper heat transfer plate 14a is installed so as to face the induction heating coil 9a via the shielding member 12a, and a lower heat transfer plate 14b is installed so as to face the induction heating coil 9b via the shielding member 12b.

A target substrate 15 for film formation on which a polymerized film will be formed is supported on the upper heat transfer plate 14a by a suitable supporting member, such that a film forming surface of the substrate 15 faces the bottom. A source material forming substrate 16 on which source materials for forming a polymerized film have been formed is mounted on the lower heat transfer plate 14b.

On the source material forming substrate 16, a first and a second source material 17 and 18 for forming a polymerized film are formed in a predetermined pattern such as a check pattern by coating, printing, photolithography or the like. The first and second source materials 17 and 18 are monomer source materials for forming a polymerized film. If a desired polymerized film is a polyimide film, the source materials may be pyromellitic dianhydride (PMDA) and 4,4'-diaminodiphenyl ether (ODA).

The lower heat transfer plate 14b is inductively heated by supplying electric power to the induction heating coil 9b, and the source material forming substrate 16 is heated to a first temperature by the heat transferred from the lower heat transfer plate 14b. Accordingly, the first and second source materials 17 and 18 are evaporated. The upper heat transfer plate 14a is inductively heated by supplying electric power to the induction heating coil 9a, and the target substrate 15 for film formation is heated to a second temperature by the heat transferred from the upper heat transfer plate 14a. Hence, the first and second source materials 17 and 18 evaporated from the surface of the source material forming substrate 16 react with each other on the surface of the target substrate 15 for film formation, which results in formation of a polymerized film. In other words, the induction heating coil 9b functions as a first heating mechanism for evaporating the source materials, and the induction heating coil 9a functions as a second heating mechanism for causing polymerization reaction.

The control unit 11 controls, in addition to power supply to the induction heating coils 9a and 9b, gas exhaust, gas supply, opening and closing of the gate valve, transfer of the substrate or the like. The control unit 11 includes a controller (computer) for executing actual control operations, a user interface having a keyboard or a display which allows an operator to perform an input operation for control, and a storage unit having a storage medium for storing information on processing recipes or the like.

Figure 3:
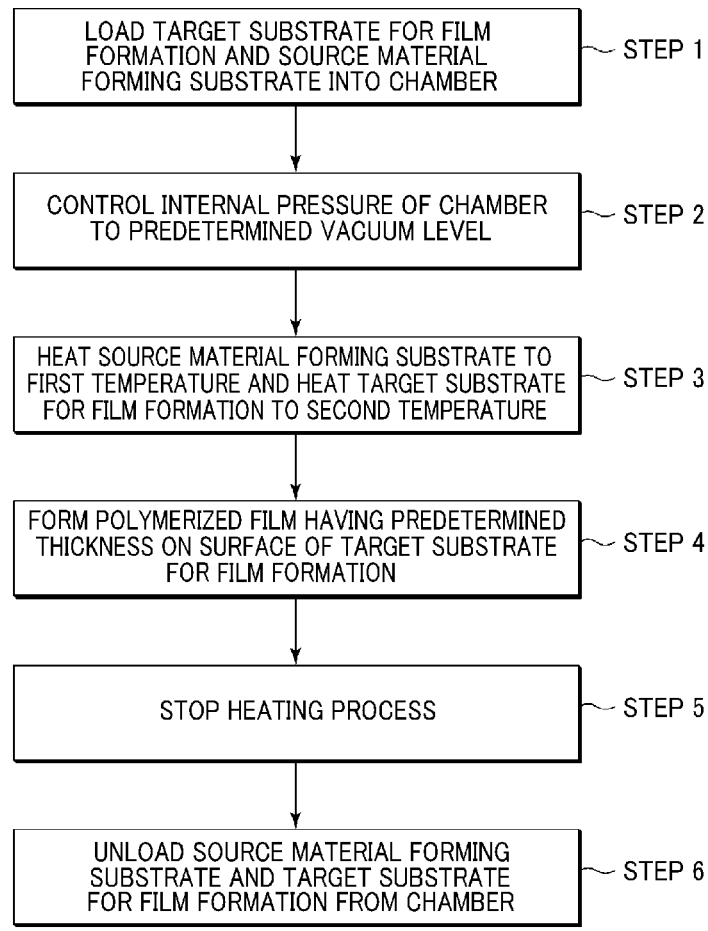
FIG. 3 is a flow chart for explaining processes of a polymerized film forming method in accordance with an embodiment of the present invention.

Hereinafter, a method for forming a polymerized film by the film forming apparatus 1 configured as described above will be described with reference to a flowchart of FIG. 3. The following method is performed based on a process recipe stored in the storage medium of in the storage unit of the control unit 11. First of all, the gate valve 5 opens, and the target substrate 15 for film formation and the source material forming substrate 16 are loaded from the loading/unloading port 3 into the chamber 2. Then, the target substrate 15 for film formation is mounted on the upper heat transfer plate 14a, and the source material forming substrate 16 is mounted on the lower heat transfer plate 14b (step 1).

Next, the gate valve 5 is closed, and the inside of the chamber 2 is sealed airtightly. The inside of the chamber 2 is evacuated by the vacuum pump 7, and a nonreactive gas is introduced from a gas introduction mechanism (not shown) into the chamber 12 if necessary. Accordingly, the internal pressure of the chamber 2 is controlled to a predetermined vacuum level (step 2).

In that state, the lower heat transfer plate 14b is inductively heated by supplying electric power to the induction heating coil 9b, and the source material forming substrate 16 is heated to the first temperature by the heat transferred from the lower heat transfer plate 14b. Further, the upper heat transfer plate 14a is inductively heated by supplying electric power to the induction heating coil 9a, and the target substrate 15 for film formation is heated to the second temperature by the heat transferred from the upper heat transfer plate 14a (step 3).

Figure 4:
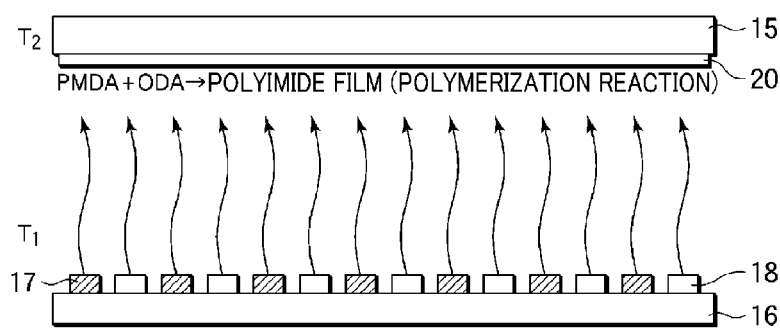
FIG. 4 is a schematic diagram for explaining a state that a polymerized film is formed by the polymerized film forming method in accordance with the embodiment of the present invention.

The first temperature is set to be a temperature suitable for evaporating the first and second source materials 17 and 18 formed on the source material forming substrate 16, and the second temperature is set to be a temperature suitable for polymerizing the first and second source materials 17 and 18 on the target substrate 15 for film formation. Therefore, as shown in FIG. 4, the first source material 17 such as PMDA and the second source material 18 such as ODA are evaporated from the surface (source material forming surface) of the source material forming substrate 16 heated to the first temperature T1, and the first and second source materials 17 and 18 cause polymerization reaction on the surface (film forming surface) of the target substrate 15 for film formation heated to the second temperature T2. By continuing the heating process for a predetermined time, a polymerized film such as a polyimide film having a desired thickness is formed on the surface of the target substrate 15 for film formation (step 4).

In addition, when a polyimide film as a polymerized film is formed by using PMDA and ODA as source materials, the first temperature can be set to be about 200° C. to about 260° C., and the second temperature can be set to be about 180° C. to about 230° C. In this case, the source material forming surface of the source material forming substrate 16 is set to be substantially the first temperature, and the film forming surface of the target substrate 15 for film formation is set to be substantially the second temperature.

The polymerized film 20 having a desired composition can be formed by setting a ratio of the first source material 17 and the second source material 18 formed on the source material forming substrate 16 to be a ratio at which a desired stoichiometric composition of a polymerized film can be obtained when the source materials is evaporated at the first temperature. Alternatively, an amount of the first source material 17 and an amount of the second source material 18 are set to form a polymerized film having a desired thickness, and a process may be stopped when the source materials are completely evaporated. Upon completion of the film formation, the first source material 17 and the second source material 18 can be formed again on the source material forming substrate 16.

After the polymerized film 20 is formed in the above-described manner, the heating process is stopped by stopping power supply to the induction heating coils 9a and 9b (step 5). Then, the gate valve 5 opens, and the target substrate 15 for film formation on which the polymerized film 20 has been formed and the source material forming substrate 16 from which the source materials has been evaporated are unloaded (step 6).

After the film forming process is repeated a predetermined number of times, the inside of the chamber 2 can be cleaned by a cleaning gas while heating the wall surface of the chamber 2 by a wall heater (not shown).

In accordance with the present embodiment, the first and second source materials 17 and 18 for forming a polymerized film are formed in a solid phase and in a predetermined pattern on the source material forming substrate 16 by coating, printing, photolithography or the like. The source materials are evaporated by inductively heating the source material forming substrate 16 to the first temperature, and then are deposited on the surface of the target substrate 15 for film formation heated by induction heating to the second temperature at which the polymerization reaction occurs, and, thus, polymerization reaction is conducted. Accordingly, a polymerized film can be stably formed by a simple method without causing a problem of insufficient heat resistance of the pipe when a high-temperature gas obtained by heating the source materials is supplied to the pipe or a problem of unstable supply of the source materials due to temperature non-uniformity during heating by the heater. The source material forming substrate 16 and the target substrate 15 for film formation can be rapidly heated or cooled to separate temperatures by induction heating. Therefore, it is possible to prevent the source materials from being supplied at a temperature different from a desired temperature or the polymerization temperature from being limited.

Hereinafter, a specific test example of the present embodiment will be described. In the film forming process shown in FIG. 1, pancake-shaped coils are used as the induction heating coils 9a and 9b, and a graphite plate having a diameter of about 210 mm and a thickness of about 2 mm is used as each of the upper heat transfer plate 14a and the lower heat transfer plate 14b. In addition, an Ar gas supply system, a cleaning gas supply system and a wall heater (all not shown) are installed.

As for the target substrate 15 for film formation, a Si wafer having a diameter of about 200 mm is used. As for the source material forming substrate 16, there is used a Si wafer having a diameter of about 200 mm on which PMDA as the first source material 17 and ODA as the second source material 18 are formed in a check pattern by printing. Each of the first source material 17 and the second source material 18 has a shape of about 5 μm square and is spaced from each other by about 1 μm.

The film formation is performed by the above-described film forming apparatus according to the following steps. First of all, in a state where electric power is not applied to the induction heating coils 9a and 9b, the target substrate 15 for film formation is mounted on the upper heat transfer plate 14a, and the source material forming substrate 16 is mounted on the lower heat transfer plate 14b. Next, the inside of the chamber 2 is evacuated, and the internal pressure of the chamber 2 is controlled to about 133 Pa.

In that state, the lower heat transfer plate 14b is inductively heated while the control unit 11 controls power supply to the induction heating coil 9b, and the temperature of the source material forming substrate 16 is controlled to about 220° C. Further, the upper heat transfer plate 14a is inductively heated while controlling power supply to the induction heating coil 9a, and the temperature of the target substrate 15 for film formation is controlled to about 200° C. Accordingly, PMDA and ODA are evaporated from the source material forming substrate 16, and the polymerization reaction occurs on the surface of the target substrate 15 for film formation, which results in formation of a polyimide film.

Here, a polyimide film having a thickness of about 1000 nm is formed by continuing the heating process at the above temperatures for about 5 minutes.

In this way, after the polyimide film as a polymerized film is formed, the power supply to the induction heating coils 9a and 9b is stopped. Then, the internal pressure of the chamber 2 is returned to the atmospheric pressure by purging the inside of the chamber 2 with Ar gas. Next, the target substrate 15 for film formation on which the polyimide film is formed and the source material forming substrate 16 are unloaded from the chamber 2.

After the film forming process is repeated a predetermined number of times, the inside of the chamber 2 is cleaned by supplying a cleaning gas, e.g., an oxygen source such as $O_2$, $O_3$, or $N_2O$ from a cleaning gas supply system into the chamber 2 while controlling the temperature of the wall surface of the chamber 2 to about 500° C. by a wall heater. During the cleaning process, if the graphite plates (the upper and the lower heat transfer plates 14a and 14b) are placed in the chamber 2, the graphite plates are decomposed by combustion. For that reason, the graphite plates are separated from the chamber 2.

In the first embodiment, the induction heating coils 9a and 9b are installed outside the processing space of the chamber 2. However, the induction heating coils 9a and 9b may be installed inside the processing space.

Figure 5:
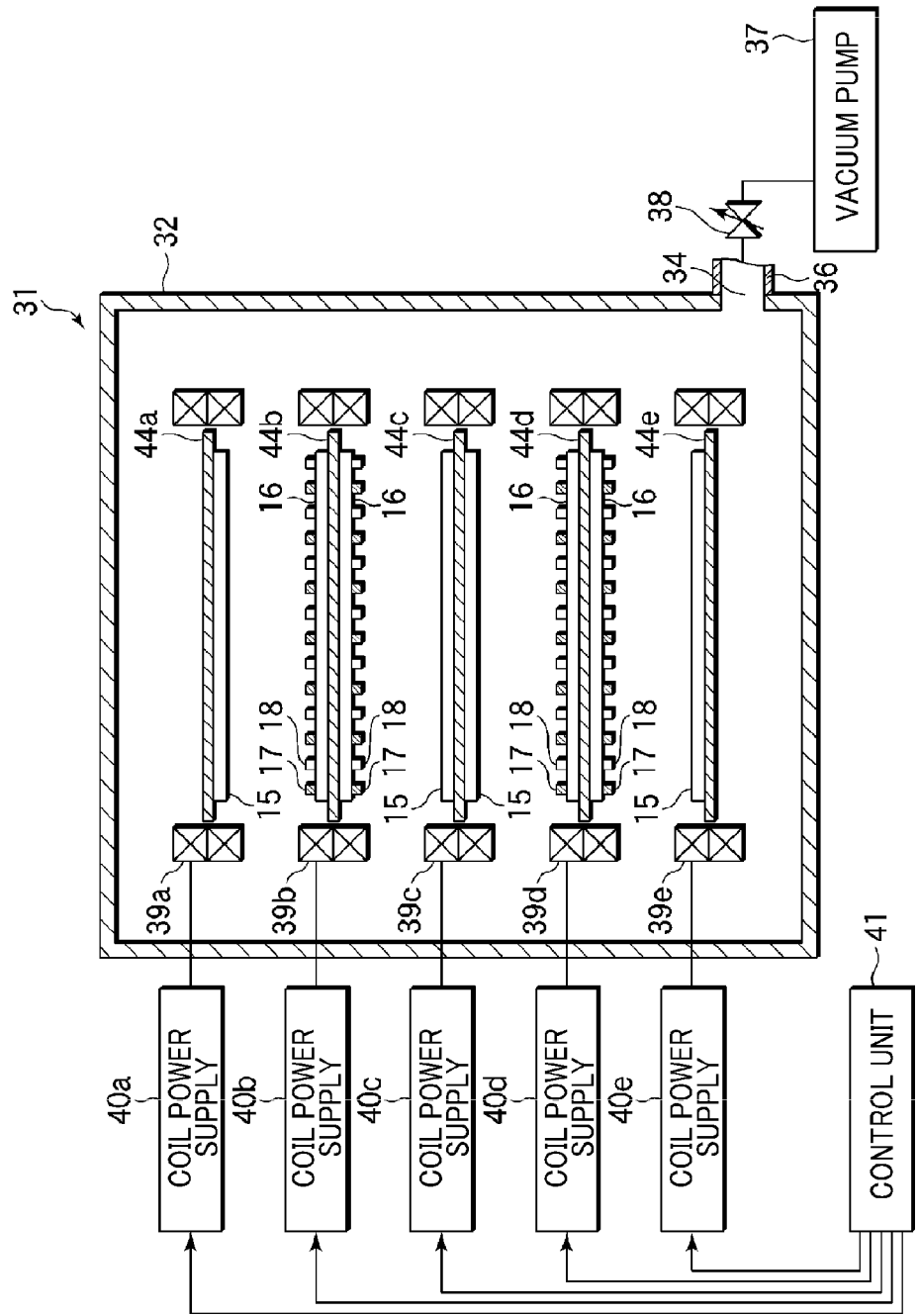
FIG. 5 is a cross sectional view showing a polymerized film forming apparatus in accordance with a second embodiment of the present invention.

Hereinafter, a second embodiment of the present invention will be described. Here, a batch-type apparatus for performing a film forming process on a multiple number of substrates will be explained. FIG. 5 is a cross sectional view of a polymerized film forming apparatus in accordance with the second embodiment of the present invention.

A film forming apparatus 31 includes a chamber 32, and a multiple number of loading/unloading ports (not shown) and a single gas exhaust port 34 are installed at a sidewall of the chamber 32. The loading/unloading ports for loading and unloading a multiple number of substrates are openable and closeable by gate valves (not shown). Moreover, the gas exhaust port 34 is connected to a gas exhaust line 36, and the gas exhaust line 36 is connected to a pressure control valve 38 and a vacuum pump 37. By controlling an opening degree of the pressure control valve 38 while operating the vacuum pump 37, an internal pressure of the chamber 32 is controlled to a predetermined vacuum level. Furthermore, the internal pressure of the chamber 32 can be controlled by introducing a nonreactive gas such as Ar gas from a gas supply system (not shown) into the chamber 32. In addition, a cleaning gas supply system that supplies a cleaning gas for cleaning the inside of the chamber 32 may be installed.

Five heat transfer plates 44a to 44e are horizontally disposed and vertically arranged in the chamber 32. Induction heating coils 39a to 39e are installed around the outer peripheries of the heat transfer plates. The induction heating coils 39a to 39e are connected with coil power supplies 40a to 40e, respectively. The coil power supplies 40a to 40e are connected with and controlled by a control unit 41. Further, the control unit 41 controls outputs of the coil power supplies 40a to 40e such that heating temperatures of the induction heating coils 39a to 39e are controlled. Moreover, a wall heater (not shown) is installed at a chamber wall, so that a temperature of the chamber wall can be controlled to a predetermined temperature level. The control unit 41 has the same configuration as that of the control unit 11 of the first embodiment and thus can perform the same control operation as that in the first embodiment.

Figure 6:
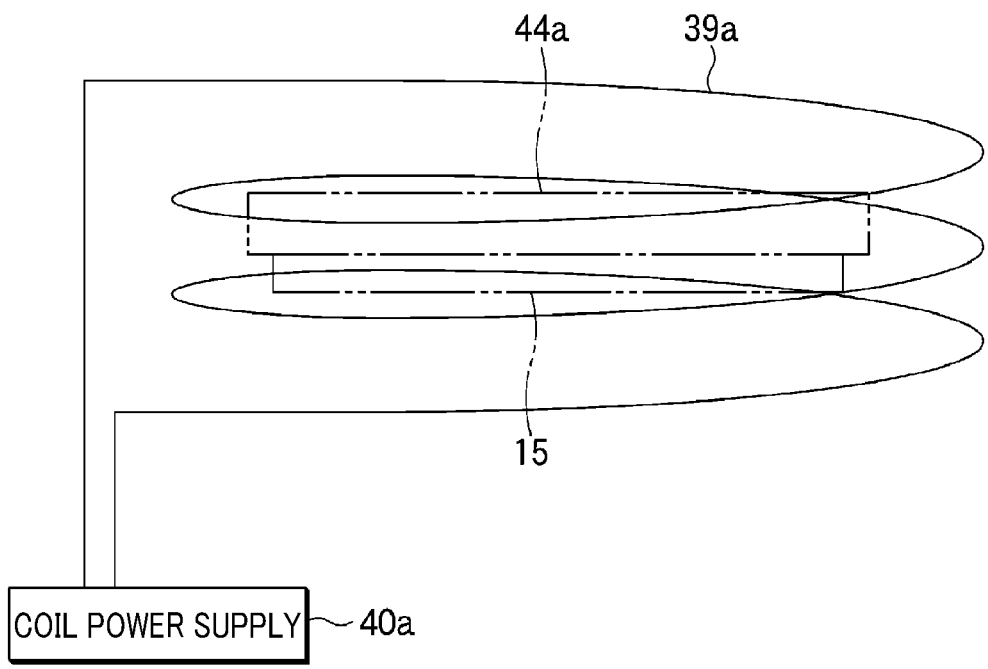
FIG. 6 is a side view of an induction heating coil of the polymerized film forming apparatus of FIG. 5.

As shown in FIG. 6, the induction heating coil 39a is wound on the outer circumference of the heat transfer plate 44a. The induction heating coils 39b to 39e are configured in the same manner as the induction heating coil 39a.

A target substrate 15 for film formation on which a polymerized film will be formed is supported on the bottom surface of the uppermost heat transfer plate 44a, such that a film forming surface of the substrate 15 faces the bottom. A source material forming substrate 16 on which source materials for forming a polymerized film has been formed is supported on each of a top surface and a bottom surface of the heat transfer plate 44b positioned below the heat transfer plate 44a. Further, a target substrate 15 for film formation on which a polymerized film will be formed is supported on each of a top surface and a bottom surface of the heat transfer plate 44c positioned below the heat transfer plate 44b. A source material forming substrate 16 on which source materials for forming a polymerized film has been formed is supported on each of a top surface and a bottom surface of the heat transfer plate 44d positioned below the heat transfer plate 44c. Moreover, a target substrate 15 for film formation is mounted on a top surface of the lowermost heat transfer plate 44e, such that a film forming surface of the substrate 15 faces the top. As described above, the first and second source materials 17 and 18 for forming a polymerized film has been formed on the source material forming substrates 16 in a predetermined pattern such as a check pattern by coating, printing, photolithography or the like.

By arranging the target substrates 15 for film formation and the source material forming substrates 16 in the above-described manner, the film forming surfaces of the target substrates 15 for film formation and the source material forming surfaces of the source material forming substrates 16 can face each other between the heat transfer plates 44a and 44b, the heat transfer plates 44b and 44c, the heat transfer plates 44c and 44d, and the heat transfer plates 44d and 44e. The heat transfer plates 44b and 44d are inductively heated by supplying electric power to the induction heating coils 39b and 39d, and the source material forming substrates 16 are heated to a first temperature by the heat transferred from the heat transfer plates 44b and 44d. The heat transfer plates 44a, 44c and 44e are inductively heated by supplying electric power to the induction heating coils 39a, 39c and 39e, and the target substrates 15 for film formation are heated to a second temperature by the heat transferred from the heat transfer plates 44a, 44c and 44e. Accordingly, the first and second source materials 17 and 18 evaporated from the surfaces of the source material forming substrates 16 reach the film forming surfaces of the facing target substrates 15 for film formation, and the source materials 17 and 18 react with each other on the film forming surface, which results in formation of polymerized films. In other words, the induction heating coils 39b and 39d function as a first heating mechanism for evaporating the source materials, and the induction heating coils 39a, 39c and 39e function as a second heating mechanism for causing polymerization reaction.

As in the first embodiment, the first and second source materials 17 and 18 are monomer source materials for forming a polymerized film. If a desired polymerized film is a polyimide film, these source materials may be pyromellitic dianhydride (PMDA) and 4,4'-diaminodiphenyl ether (ODA).

In the second embodiment, the polymerized film can be formed basically in the same manner as that in the first embodiment. However, the second embodiment is more effective than the first embodiment in that the polymerized films can be formed on four target substrates 15 for film formation at one time.

In accordance with a specific test example of the second embodiment, a graphite plate having a diameter of about 210 mm and a thickness of about 2 mm is used as each of the heat transfer plates 44a to 44e. Further, an Ar gas supply system, a cleaning gas supply system and a wall heater (all not shown) are installed. As for the target substrate 15 for film formation, a Si wafer having a diameter of about 200 mm is used. As for the source material forming substrate 16, there is used a Si wafer having a diameter of about 200 mm on which PMDA as the first source material 17 and ODA as the second source material 18 are formed in a check pattern by printing. Each of the first source material 17 and the second source material 18 has a shape of about 5 μm square and is spaced from each other by about 1 μm. At this time, the internal pressure of the chamber 2 is controlled to about 133 Pa. Moreover, the temperature of the source material forming substrate 16 is controlled to about 220° C., and the temperature of the target substrate 15 for film formation is controlled to about 200° C. By continuing the heating process for about five minutes, a polyimide film having a thickness of about 1000 nm is formed.

In the second embodiment, the induction heating coils 39a to 39e are provided inside the processing space of the chamber 32. However, the induction heating coils 39a to 39e may be provided outside the chamber 32. In the above-described example, the polymerized films are formed on the four target substrates 15 for film formation at one time. However, the number of the target substrates 15 for film formation on which the polymerized film can be formed at one time can vary by adjusting the number of the heat transfer plates.

In accordance with the embodiments of the present invention, the first substrate has a source material forming surface on which a plurality of solid source materials for forming a polymerized film is formed in a predetermined pattern, and the second substrate has a film forming surface on which the polymerized film will be formed. The first substrate and the second substrate are installed in the processing chamber such that the source material forming surface and the film forming surface face each other. Further, the first and second substrates are independently heated to desired temperatures, and the source materials evaporated from the first substrate react with each other on the film forming surface of the second substrate, thereby forming the polymerized film on the film forming surface. Accordingly, the polymerized film can be stably formed by a simple method without causing a problem of insufficient heat resistance of the pipe when a high-temperature gas obtained by heating the source materials is supplied to the pipe or a problem of unstable supply of the source materials due to temperature non-uniformity during heating by the heater. In addition, since the source material forming substrate and the target substrate for film formation are separately heated to different temperatures by the heating mechanism capable of performing rapid heating and cooling such as induction heating, it is possible to prevent the source materials from being supplied at a temperature different from a desired temperature or the polymerization temperature from being limited.

The present invention can be variously modified without being limited to the above-described embodiments. For example, the film forming apparatus may have another configuration other than those described in the first and second embodiments. Further, in the above-described example, the induction heating coils capable of performing rapid local heating and cooling are used in order to independently heat the target substrate for film formation and the source material forming substrate. However, it is also possible to use another heating unit such as a heating lamp.

Although the above-described embodiments have described the example in which the polymerized film is formed by using the first and second source materials, the polymerized film can also be formed by using three or more source materials. Furthermore, the above-described embodiments have described the example in which the polyimide film is formed by using PMDA and ODA as source material monomers. However, the present invention is not limited thereto and can also be applied to various cases of forming a polymerized film by using a multiple number of monomer source materials, such as formation of a polyimide film using perylenetetracarboxylic dianhydride (PTCDA) and 2,3-diaminonaphthalene (DAN), formation of a polyurea (PU) film using 4,4'-diphenylmethane diisocyanate (MD1) and 4,4'-methylenedianiline (MDA), formation of a polyazomethine film as π-conjugated conductive polymer using 2,3-diaminonaphthalene (DAN) and α-bromocinnamaldehyde (BCA), and the like.

Figure 7:
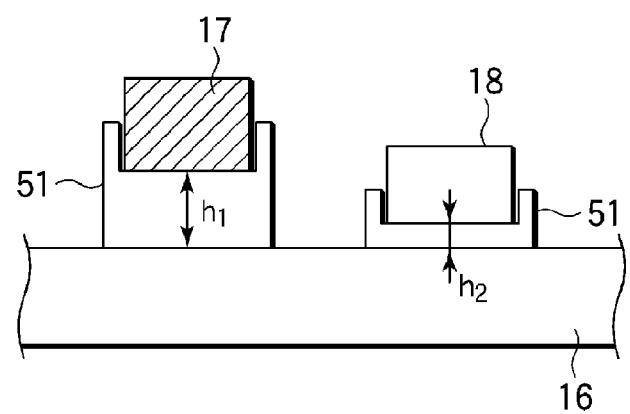
FIG. 7 is a diagram for explaining a technique for adjusting heating temperatures of a first and a second source material on a source material forming substrate to be different levels.

Besides, in the above-described embodiments, the first and second source materials are heated to the same temperature. However, the heating temperatures of the first and the second source material can be set to different levels. To do so, as shown in FIG. 7, heat transfer adjustment jigs 51 made of a material having relatively high heat insulation property such as ceramic are installed on the source material forming substrate 16 and, then, the first and second source materials 17 and 18 are formed thereon. Then, the heat transfer to the first and second source materials 17 and 18 is controlled by adjusting the heights of the heat transfer adjustment jigs 51 to be h1 and h2.

INDUSTRIAL APPLICABILITY

The polymerized film forming method of the present invention can be suitably used for forming a high-performance polymerized film used as an insulating film of a three-dimensional package in a semiconductor field or the like.

What is claimed is:

1. A polymerized film forming method comprising:
providing, in a processing chamber, a first substrate having a source material forming surface on which a plurality of solid source materials for forming a polymerized film is formed in a predetermined pattern and a second substrate having a film forming surface on which the polymerized film is formed, the source material forming surface and the film forming surface facing each other;
setting the internal pressure of the processing chamber where the first substrate and the second substrate are provided to a predetermined vacuum level by evacuating the inside of the processing chamber; and
heating, under the predetermined vacuum level, the first substrate by a first heating device to a first temperature at which the source materials on the source material forming surface are evaporated and heating the second substrate by a second heating device which is different from the first heating device to a second temperature at which the source materials cause polymerization reaction on the film forming surface,
wherein the first temperature and the second temperature are controlled independently,
the polymerized film is formed on the film forming surface by reacting the source materials evaporated from the first substrate on the film forming surface of the second substrate, and
the second temperature is controlled to be both lower than the first temperature and sufficient for said polymerization reaction on the film forming surface.

2. The polymerized film forming method of claim 1, wherein the source materials are formed on the source material forming surface of the first substrate by any one of coating, printing and photolithography.

3. The polymerized film forming method of claim 1, wherein the source materials are formed on the source material forming surface of the first substrate and evaporated so as to obtain a stoichiometric composition of the polymerized film.

4. The polymerized film forming method of claim 1, wherein the source materials include a first source material and a second source material.

5. The polymerized film forming method of claim 4, wherein the first source material and the second source material are formed in a check pattern on the source material forming surface of the first substrate.

6. The polymerized film forming method of claim 1, wherein the heating devices have induction heating coils.

7. The polymerized film forming method of claim 1, wherein the source materials of the first substrate are formed on a heat transfer adjustment member for adjusting heat transfer to allow each of the temperatures of the source materials to reach an optimal level when the first substrate is heated to the first temperature.

8. The polymerized film forming method of claim 1, wherein a polyimide film as the polymerized film is formed by using pyromellitic dianhydride (PMDA) and 4, 4'-diaminodiphenyl ether (ODA) as the source materials.

9. The polymerized film forming method of claim 8, wherein the first temperature is within a range of about 200° C. to about 260° C., and the second temperature is within a range of about 180° C. to about 230° C.

* * * * *

UNITED STATES PATENT AND TRADEMARK OFFICE
CERTIFICATE OF CORRECTION

PATENT NO.         : 8,691,338 B2
APPLICATION NO.    : 13/063779
DATED              : April 8, 2014
INVENTOR(S)        : Kawano et al.

Page 1 of 1

It is certified that error appears in the above-identified patent and that said Letters Patent is hereby corrected as shown below:

In the specification, column 6, line 3, please add - 20 - between "film" and "such"

Signed and Sealed this
Twenty-second Day of July, 2014

Michelle K. Lee
*Deputy Director of the United States Patent and Trademark Office*